(12) United States Patent
Ueki et al.

(10) Patent No.: US 11,239,017 B2
(45) Date of Patent: Feb. 1, 2022

(54) COMMON MODE CHOKE COIL AND ELECTRONIC APPARATUS

(71) Applicant: Murata Manufacturing Co., Ltd., Nagaokakyo (JP)

(72) Inventors: Noriyuki Ueki, Nagaokakyo (JP); Noboru Kato, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 968 days.

(21) Appl. No.: 15/933,526

(22) Filed: Mar. 23, 2018

(65) Prior Publication Data

US 2018/0211755 A1  Jul. 26, 2018

Related U.S. Application Data

(63) Continuation of application No. PCT/JP2016/084374, filed on Nov. 21, 2016.

(30) Foreign Application Priority Data

Dec. 9, 2015  (JP) .............................. JP2015-239972

(51) Int. Cl.
*H01F 5/00* (2006.01)
*H01F 17/00* (2006.01)
(Continued)

(52) U.S. Cl.
CPC ......... *H01F 17/0013* (2013.01); *H01F 19/04* (2013.01); *H01F 27/292* (2013.01);
(Continued)

(58) Field of Classification Search
USPC ......................................... 336/199, 105, 200
See application file for complete search history.

(56) References Cited

U.S. PATENT DOCUMENTS

2007/0001777 A1* 1/2007 Wasaki .................... H04B 3/28
                                                                   333/12
2007/0057578 A1* 3/2007 Wasaki .................. H03H 7/427
                                                                   307/89
(Continued)

FOREIGN PATENT DOCUMENTS

JP  2001-197665 A  7/2001
JP  2012-019504 A  1/2012
(Continued)

OTHER PUBLICATIONS

Official Communication issued in International Patent Application No. PCT/JP2016/084374, dated Dec. 27, 2016.

*Primary Examiner* — Shawki S Ismail
*Assistant Examiner* — Kazi S Hossain
(74) *Attorney, Agent, or Firm* — Keating & Bennett, LLP

(57) ABSTRACT

A common mode choke coil includes a differential transmission line including first and second signal lines, a main circuit including a first coil provided in the first signal line, and a second coil provided in the second signal line and connected to the first coil by magnetic field coupling, and a parallel resonance circuit including a third coil connected to both the first and second coils by magnetic field coupling, and a first capacitor electrically connected in parallel to the third coil. In the common mode choke coil, a first resonant frequency of the main circuit is equal or substantially equal to a second resonant frequency of the parallel resonance circuit.

20 Claims, 13 Drawing Sheets

(51) Int. Cl.
*H01F 19/04* (2006.01)
*H01F 27/29* (2006.01)
*H01F 41/04* (2006.01)
*H03H 7/09* (2006.01)
*H03H 7/42* (2006.01)
*H03H 1/00* (2006.01)

(52) U.S. Cl.
CPC ..... *H01F 41/04* (2013.01); *H01F 2017/0093* (2013.01); *H03H 7/09* (2013.01); *H03H 7/427* (2013.01); *H03H 2001/0085* (2013.01)

(56) References Cited

U.S. PATENT DOCUMENTS

2011/0316624 A1* 12/2011 Kimball .............. H01F 27/2804
330/189
2014/0306787 A1* 10/2014 Kato ...................... H03H 7/427
336/105
2016/0104569 A1* 4/2016 Kato ...................... H01F 27/343
336/105

FOREIGN PATENT DOCUMENTS

| JP | 2012019504 | * | 1/2012 |
| JP | 2012-195332 A | | 10/2012 |
| JP | 2014-107653 A | | 6/2014 |
| WO | 2013/099540 A1 | | 7/2013 |

* cited by examiner

Lp1: 18a-18k, v1-v10
Lp2: 18l-18s, v14-v20
Lp3: 20a-20k, v21-v30
Lp4: 20l-20s, v34-v40

COMMON MODE CHOKE COIL AND ELECTRONIC APPARATUS

CROSS REFERENCE TO RELATED APPLICATIONS

This application claims the benefit of priority to Japanese Patent Application No. 2015-239972 filed on Dec. 9, 2015 and is a Continuation Application of PCT Application No. PCT/JP2016/084374 filed on Nov. 21, 2016. The entire contents of each application are hereby incorporated herein by reference.

BACKGROUND OF THE INVENTION

1. Field of the Invention

The present invention relates to a common mode choke coil including a first coil and a second coil connected to each other by magnetic field coupling, and an electronic apparatus including such a common mode choke coil.

2. Description of the Related Art

A common mode noise filter disclosed in Japanese Unexamined Patent Application Publication No. 2012-195332 is known as an example of an existing common mode choke coil. FIG. 16 is an equivalent circuit diagram of a common mode filter 500 disclosed in Japanese Unexamined Patent Application Publication No. 2012-195332.

As illustrated in FIG. 16, the common mode filter 500 includes coils 502, 504, 506 and 508, and input-output terminals 510, 512, 514 and 516. The coils 502 and 504 are connected in series between the input-output terminal 510 and the input-output terminal 512. The coils 506 and 508 are connected in series between the input-output terminal 514 and the input-output terminal 516. The coil 502 and the coil 506 are connected to each other by magnetic field coupling to configure a first filter section. The coil 504 and the coil 508 are connected to each other by magnetic field coupling to configure a second filter section. A coupling coefficient between the first filter section and the second filter section is set to −0.5 to +0.5.

According to the common mode filter 500, the first filter section and the second filter section form attenuation poles in two different frequency bands in the common mode attenuation characteristics. This makes it possible for the common mode filter 500 to remove common mode noise in a wide frequency band.

However, in the common mode filter 500 disclosed in Japanese Unexamined Patent Application Publication No. 2012-195332, large transmission loss is likely to be generated for reasons explained below. More specifically, in the common mode filter 500, in order to form two attenuation poles, the coils 502 and 504 are connected in series, and the coils 506 and 508 are also connected in series. Because of this, a DC resistance value between the input-output terminals 510 and 512, and a DC resistance value between the input-output terminals 514 and 516 undesirably become large. As a result, large transmission loss is generated in the common mode filter 500.

SUMMARY OF THE INVENTION

Preferred embodiments of the present invention provide common mode choke coils and electronic apparatuses capable of attenuating common mode noise in a wide frequency band and reducing transmission loss.

A common mode choke coil according to a preferred embodiment of the present invention includes a differential transmission line including a first signal line and a second signal line; a main circuit including a first coil provided in the first signal line, and a second coil provided in the second signal line and connected to the first coil by magnetic field coupling; and a parallel resonance circuit including a third coil connected to both the first coil and the second coil by magnetic field coupling, and a first capacitor electrically connected in parallel to the third coil. In the common mode choke coil, a first resonant frequency of the main circuit is the same or substantially the same as a second resonant frequency of the parallel resonance circuit.

An electronic apparatus according to a preferred embodiment of the present invention includes an electric circuit and a common mode choke coil. The common mode choke coil includes a differential transmission line including a first signal line and a second signal line that are electrically connected to the electric circuit; a main circuit including a first coil provided in the first signal line, and a second coil provided in the second signal line and connected to the first coil by magnetic field coupling; and a parallel resonance circuit including a third coil connected to both the first coil and the second coil by magnetic field coupling, and a first capacitor electrically connected in parallel to the third coil. In the common mode choke coil, a first resonant frequency of the main circuit is equal or substantially equal to a second resonant frequency of the parallel resonance circuit.

According to preferred embodiments of the present invention, common mode noise is attenuated in a wide frequency band and transmission loss is reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the common mode choke coil 10 and the electronic apparatus 100 according to preferred embodiments of the present invention will be described with reference to the drawings.

Figure 1:
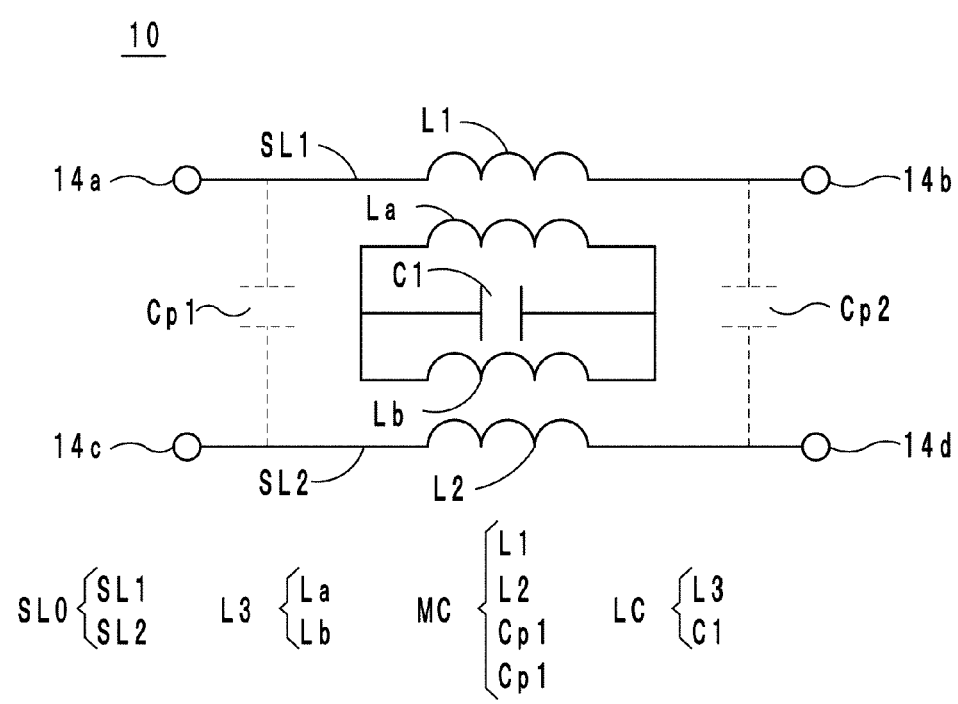
FIG. 1 is an equivalent circuit diagram of a common mode choke coil 10 according to a preferred embodiment of the present invention.

First, an equivalent circuit diagram of the common mode choke coil 10 will be described with reference to the drawings. FIG. 1 is an equivalent circuit diagram of the common mode choke coil 10.

As illustrated in FIG. 1, the common mode choke coil 10 preferably includes a differential transmission line SL0, a main circuit MC, a parallel resonance circuit LC, and outer electrodes 14a to 14d. The differential transmission line SL0 is a signal line to transmit a differential mode signal, and preferably includes a signal line SL1 (an example of a first signal line) and a signal line SL2 (an example of a second signal line). One end of the signal line SL1 is connected to the outer electrode 14a, and the other end of the signal line SL1 is connected to the outer electrode 14b. One end of the signal line SL2 is connected to the outer electrode 14c, and the other end of the signal line SL2 is connected to the outer electrode 14d.

The main circuit MC preferably includes a coil L1 (an example of a first coil), a coil L2 (an example of a second coil), parasitic capacitance Cp1, and parasitic capacitance Cp2. The coil L1 is provided in the signal line SL1. The coil L2 is provided in the signal line SL2. The coils L1 and L2 are connected to each other by magnetic field coupling. The parasitic capacitance (capacitor) Cp1 and parasitic capacitance (capacitor) Cp2 are parasitic capacitance generated between the coil L1 and the coil L2. The parasitic capacitance Cp1 is connected between one end of the coil L1 and one end of the coil L2. The parasitic capacitance Cp2 is connected between the other end of the coil L1 and the other end of the coil L2.

The resonant frequency of the main circuit MC configured as described above is a frequency f1 (an example of a first resonant frequency). The frequency f1 is determined by inductance values of the coils L1 and L2, and capacitance values of the parasitic capacitance Cp1 and parasitic capacitance Cp2. In the present preferred embodiment, the frequency f1 is preferably 3.2 GHz, for example.

The parallel resonance circuit LC includes a coil L3 (an example of a third coil) and a capacitor C1 (an example of a first capacitor). Further, the coil L3 preferably includes coils La and Lb. The coil La, the coil Lb, and the capacitor C1 are connected in parallel to one another. The coil La is connected to the coils L1 and L2 by magnetic field coupling, and mainly connected to the coil L1 by magnetic field coupling. The coil Lb is connected to the coils L1 and L2 by magnetic field coupling, and mainly connected to the coil L2 by magnetic field coupling. Note that the parallel resonance circuit LC is connected to none of the signal lines SL1 and SL2.

The resonant frequency of the parallel resonance circuit LC configured as described above is a frequency f2 (an example of a second resonant frequency). The frequency f2 is determined by an inductance value of the coil L3 and a capacitance value of the capacitor C1. The common mode choke coil 10 is structured such that the frequency f1 and the frequency f2 are equal or substantially equal to each other. In the present preferred embodiment, the frequency f2 is 3.5 GHz, for example.

Figure 2:
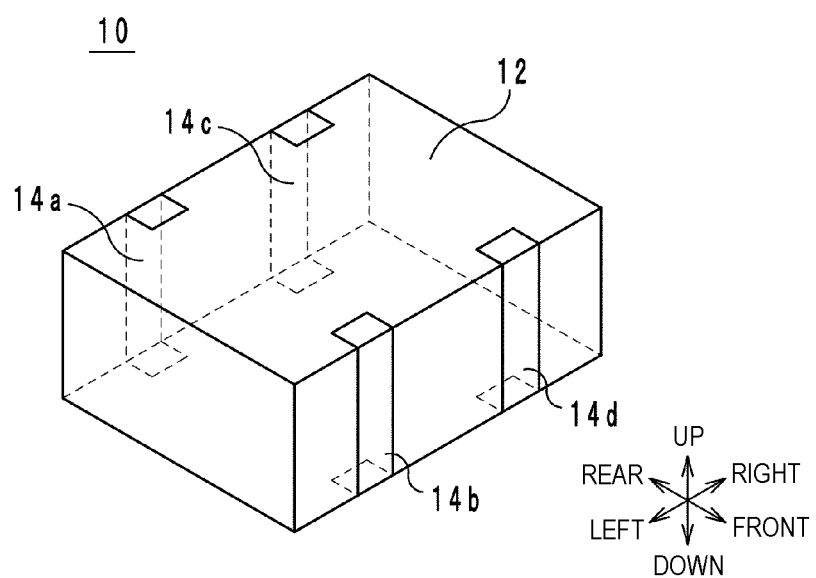
FIG. 2 is an external appearance perspective view of the common mode choke coil 10.
Figure 3:
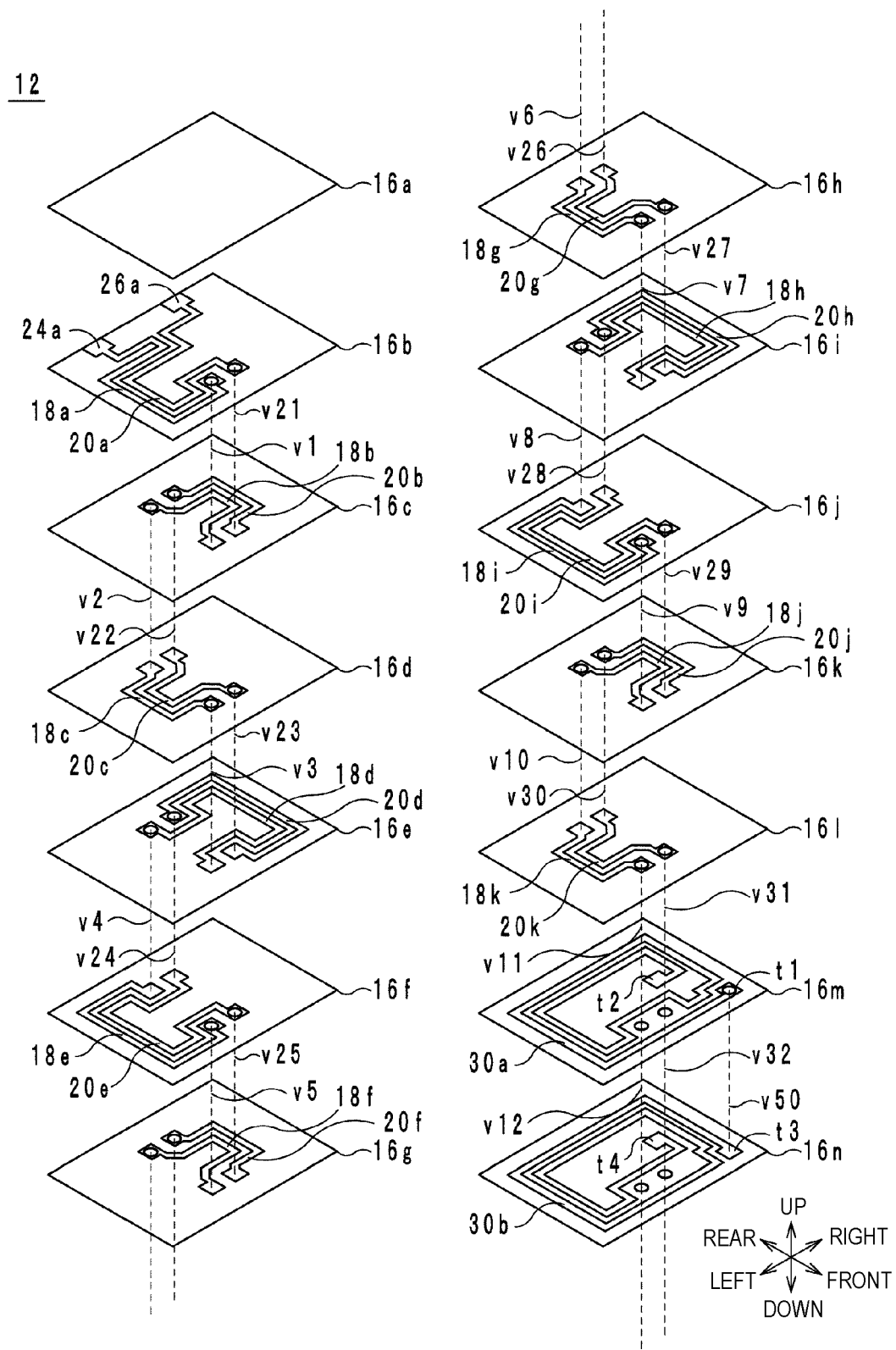
FIG. 3 is an exploded perspective view of an element body 12 of the common mode choke coil 10.
Figure 4:
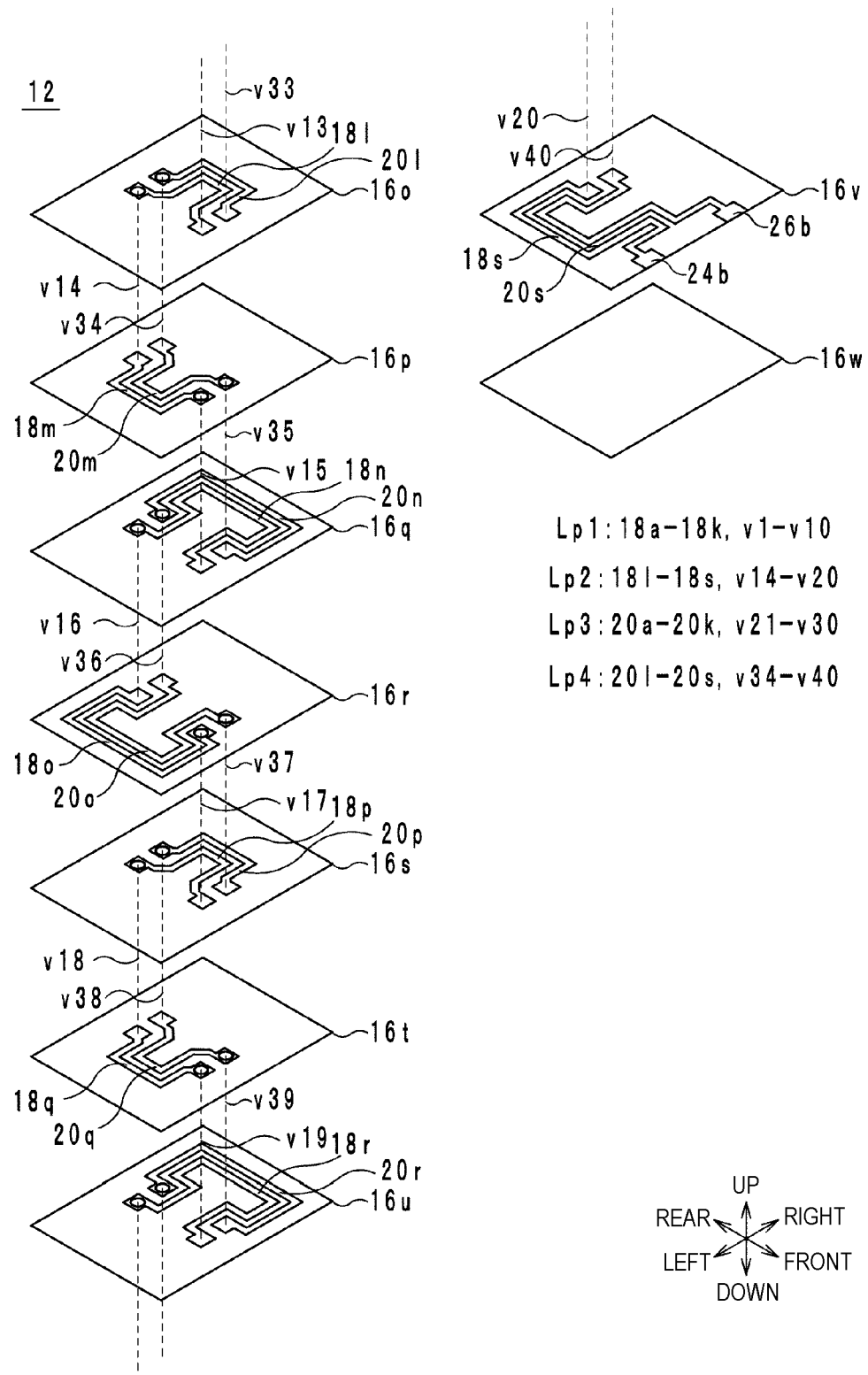
FIG. 4 is an exploded perspective view of the element body 12 of the common mode choke coil 10.
Figure 5:
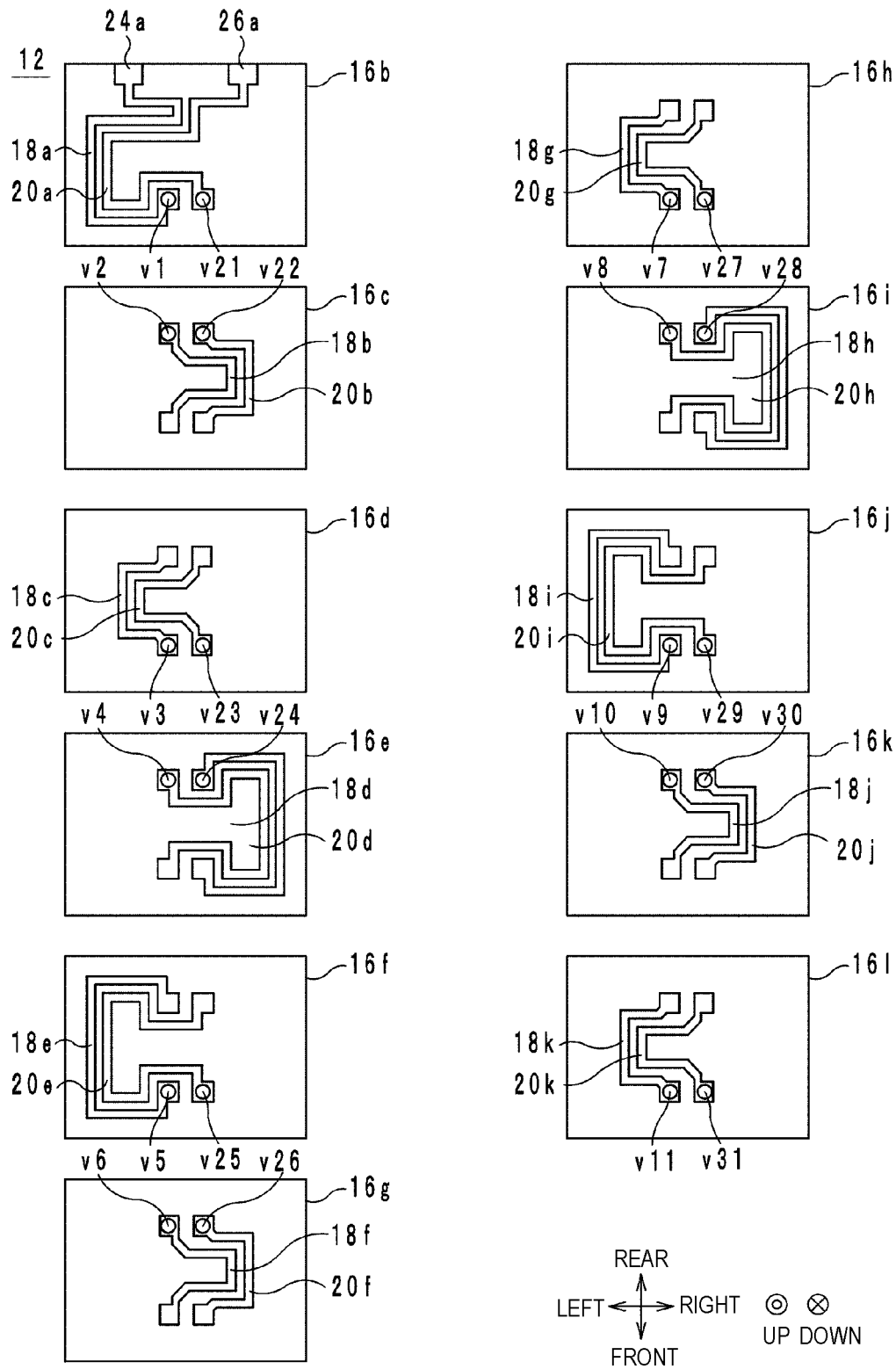
FIG. 5 is an exploded view of the element body 12 of the common mode choke coil 10.
Figure 6:
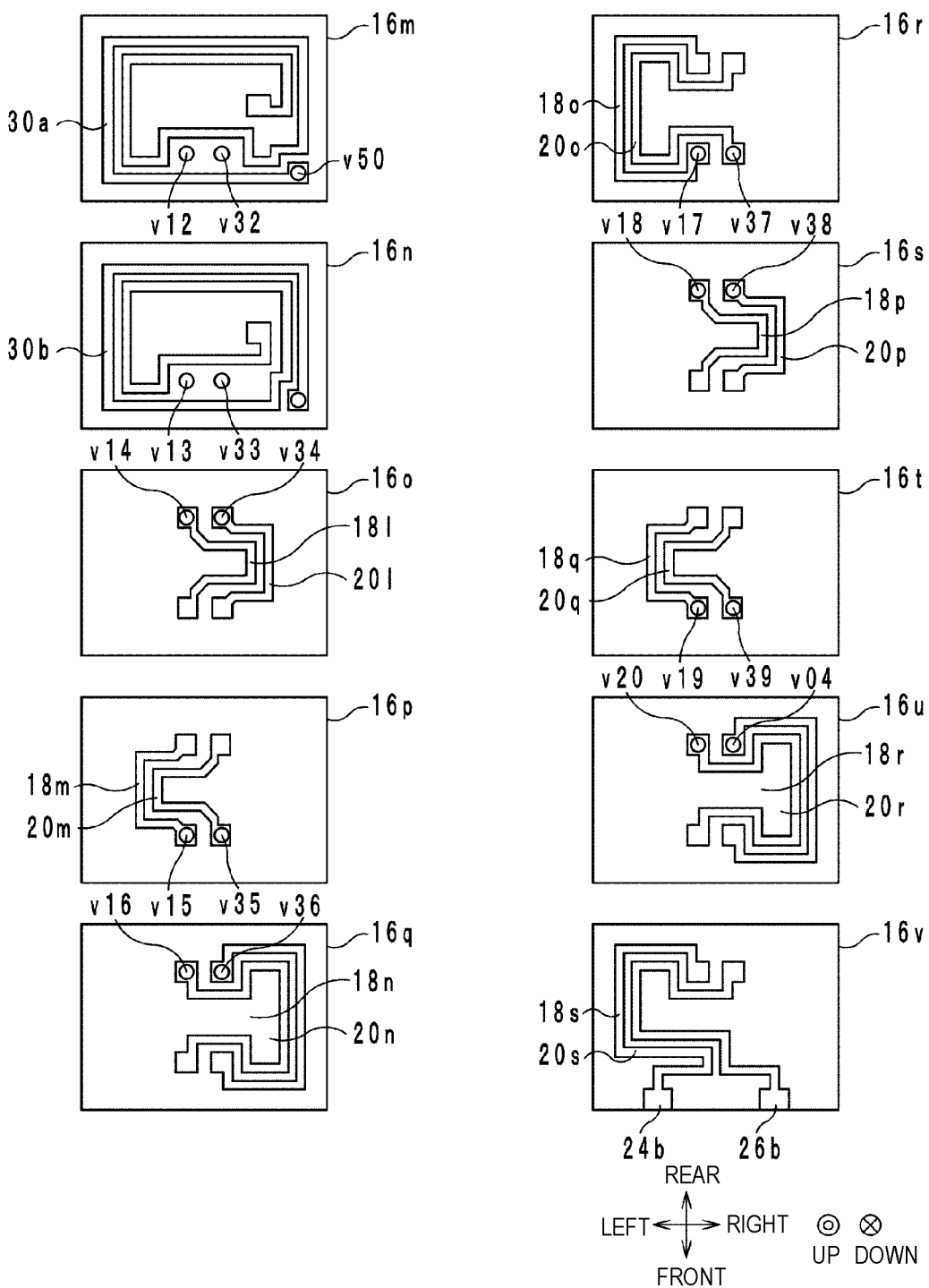
FIG. 6 is an exploded view of the element body 12 of the common mode choke coil 10.
Figure 7:
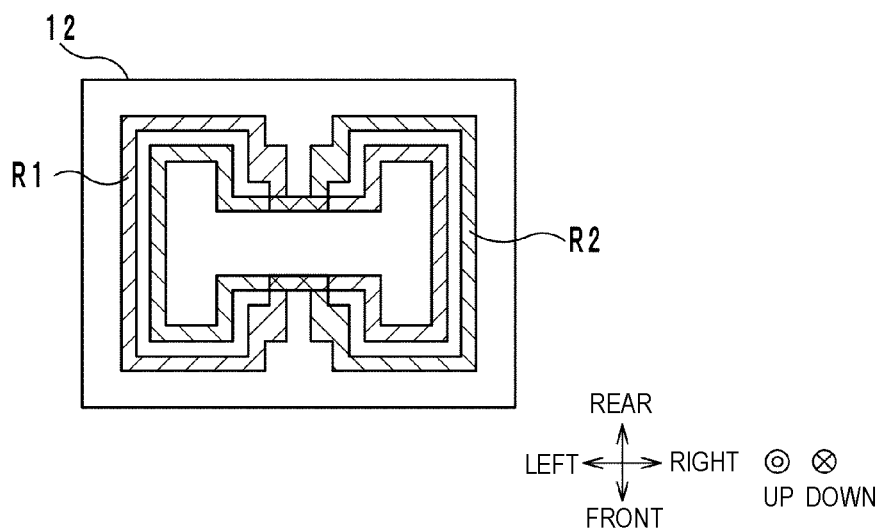
FIG. 7 is a diagram illustrating trajectories R1 and R2 according to a preferred embodiment of the present invention.
Figure 8:
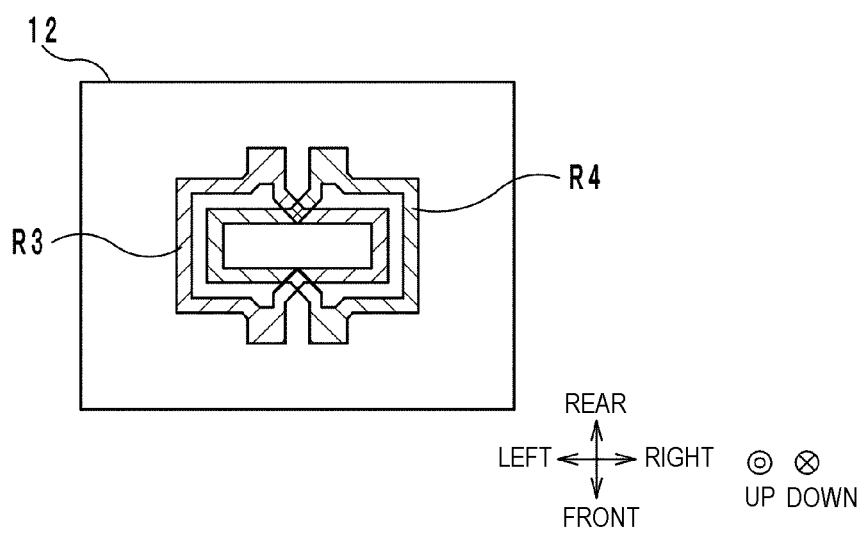
FIG. 8 is a diagram illustrating trajectories R3 and R4 according to a preferred embodiment of the present invention.

Next, a specific configuration of the common mode choke coil 10 will be described with reference to the drawings. FIG. 2 is an external appearance perspective view of the common mode choke coil 10. FIGS. 3 and 4 are each an exploded perspective view of the element body 12 of the common mode choke coil 10. FIGS. 5 and 6 are each an exploded view of the element body 12 of the common mode choke coil 10. Note that in FIGS. 5 and 6, insulator layers 16a and 16w are not illustrated. FIG. 7 is a diagram illustrating trajectories R1 and R2. FIG. 8 is a diagram illustrating trajectories R3 and R4.

Hereinafter, a lamination direction of the element body 12 is referred to as an up-down direction (an example of a first direction), a direction in which a long side of the element body 12 extends, when the element body 12 being viewed from the upper side, is defined as a right-left direction, and a direction in which a short side of the element body 12 extends is defined as a front-rear direction. The up-down direction, the right-left direction, and the front-rear direction are orthogonal to one another.

The common mode choke coil 10 preferably includes, as a specific configuration, the element body 12, the outer electrodes 14a to 14d, coil conductor layers 18a to 18s, 20a to 20s, 30a and 30b, extended conductor layers 24a, 24b, 26a and 26b, and via hole conductors v1 to v40, and v50.

The element body 12 is preferably defined by insulator layers 16a to 16w (an example of a plurality of base material layers) being laminated in that order from the upper side toward the lower side. The insulator layers 16a to 16w are each provided in a rectangular shape, and LTCC (Low Temperature Co-fired Ceramics) is preferably used as the material thereof. Hereinafter, a principal surface on the upper side of each of the insulator layers 16a to 16w will be referred to as a front surface, and a principal surface on the lower side of each of the insulator layers 16a to 16w will be referred to as a reverse surface.

The outer electrode 14a has a belt shape extending in the up-down direction in the left half region of a rear surface of the element body 12. The outer electrode 14b has a belt shape extending in the up-down direction in the left half region of a front surface of the element body 12. The outer electrode 14c has a belt shape extending in the up-down direction in the right half region of the rear surface of the element body 12. The outer electrode 14d has a belt shape extending in the up-down direction in the right half region of the front surface of the element body 12. The outer electrodes 14a to 14d are folded back onto an upper surface and a lower surface. The above-discussed outer electrodes 14a to 14d are preferably made of Ni plating and Sn plating being applied on an underlying electrode whose main ingredient is copper.

The coils L1 to L3 and the capacitor C1 are preferably defined with conductor layers provided on insulator layers, as described below.

The coil L1 preferably has a spiral shape including a winding axis extending in the up-down direction (not illustrated); in the present preferred embodiment, when viewed from the upper side, the coil L1 has a spiral shape extending forward from the upper side toward the lower side while looping in a counterclockwise direction. The winding axis of the coil L1 is positioned on an intersecting point of diagonal lines of the element body 12 when viewed from the upper side. The coil L1 includes the coil conductor layers 18a to 18s (an example of a plurality of first coil conductor layers) and the via hole conductors v1 to v20 (an example of a first interlayer connection conductor).

The coil conductor layers 18a to 18s are linear conductor layers respectively provided on the front surfaces of the insulator layers 16b to 16l and 16o to 16v, and define trajectories R1 and R3 by overlapping with one another when viewed from the upper side, as illustrated in FIGS. 7 and 8. The trajectories R1 and R3 are each preferably formed in a rectangular shape. Note that, however, the left half of each of the trajectories R1 and R3 is larger in size than the right half of each of the trajectories R1 and R3. In addition, a diameter of the trajectory R1 (an example of a second diameter) is larger than a diameter of the trajectory R3 (an example of a first diameter). The trajectory R3 is enclosed within the trajectory R1. The trajectories R1 and R3 are not circular, but are instead preferably rectangular. Because of this, an average value of distance from the center of gravity of each of the trajectories R1 and R3 to each of the trajectories R1 and R3 is taken as the diameter of each of the trajectories R1 and R3.

Each of the coil conductor layers 18a, 18e, 18i, 18o, and 18s is provided in the left half region on the front surface of each of the insulator layers 16b, 16f, 16j, 16r, and 16v. Each of the coil conductor layers 18a, 18e, 18i, 18o, and 18s loops in the counterclockwise direction from the vicinity of the center of a long side on the rear side of each of the insulator layers 16b, 16f, 16j, 16r, and 16v to the vicinity of the center of a long side on the front side of each of the insulator layers 16b, 16f, 16j, 16r, and 16v, and has a length equivalent to a half loop. The coil conductor layers 18a, 18e, 18i, 18o, and 18s overlap with the left half of the trajectory R1, and each have a relatively large diameter (an example of the second diameter).

Each of the coil conductor layers 18d, 18h, 18n, and 18r is provided in the right half region on the front surface of each of the insulator layers 16e, 16i, 16q, and 16u. Each of the coil conductor layers 18d, 18h, 18n, and 18r loops in the counterclockwise direction from the vicinity of the center of a long side on the front side of each of the insulator layers 16e, 16i, 16q, and 16u to the vicinity of the center of a long side on the rear side of each of the insulator layers 16e, 16i, 16q, and 16u, and has a length equivalent to a half loop. The coil conductor layers 18d, 18h, 18n, and 18r overlap with the right half of the trajectory R1, and each have a relatively large diameter (an example of the second diameter).

Each of the coil conductor layers 18c, 18g, 18k, 18m, and 18q is provided in the left half region on the front surface of each of the insulator layers 16d, 16h, 16l, 16p, and 16t. Each of the coil conductor layers 18c, 18g, 18k, 18m, and 18q loops in the counterclockwise direction from the vicinity of the center of a long side on the rear side of each of the insulator layers 16d, 16h, 16l, 16p, and 16t to the vicinity of the center of a long side on the front side of each of the insulator layers 16d, 16h, 16l, 16p, and 16t, and has a length equivalent to a half loop. The coil conductor layers 18c, 18g, 18k, 18m, and 18q overlap with the left half of the trajectory R3, and each have a relatively small diameter (an example of the first diameter).

Each of the coil conductor layers 18b, 18f, 18j, 18l, and 18p is provided in the right half region on the front surface of each of the insulator layers 16c, 16g, 16k, 16o, and 16s. Each of the coil conductor layers 18b, 18f, 18j, 18l, and 18p loops in the counterclockwise direction from the vicinity of the center of a long side on the front side of each of the insulator layers 16c, 16g, 16k, 16o, and 16s to the vicinity of the center of a long side on the rear side of each of the insulator layers 16c, 16g, 16k, 16o, and 16s, and has a length equivalent to a half loop. The coil conductor layers 18b, 18f, 18j, 18l, and 18p overlap with the right half of the trajectory R3, and each have a relatively small diameter (an example of the first diameter).

In the above-discussed coil conductor layers 18a to 18s, an end portion on the upstream side in the counterclockwise direction is referred to as an upstream end, and an end portion on the downstream side in the counterclockwise direction is referred to as a downstream end.

The via hole conductor v1 passes through the insulator layer 16b in the up-down direction to connect the downstream end of the coil conductor layer 18a and the upstream end of the coil conductor layer 18b. The via hole conductor v2 passes through the insulator layer 16c in the up-down direction to connect the downstream end of the coil conductor layer 18b and the upstream end of the coil conductor layer 18c. The via hole conductor v3 passes through the insulator layer 16d in the up-down direction to connect the downstream end of the coil conductor layer 18c and the upstream end of the coil conductor layer 18d. The via hole conductor v4 passes through the insulator layer 16e in the up-down direction to connect the downstream end of the coil conductor layer 18d and the upstream end of the coil conductor layer 18e. The via hole conductor v5 passes through the insulator layer 16f in the up-down direction to connect the downstream end of the coil conductor layer 18e and the upstream end of the coil conductor layer 18f. The via hole conductor v6 passes through the insulator layer 16g in the up-down direction to connect the downstream end of the coil conductor layer 18f and the upstream end of the coil conductor layer 18g. The via hole conductor v7 passes through the insulator layer 16h in the up-down direction to connect the downstream end of the coil conductor layer 18g and the upstream end of the coil conductor layer 18h. The via hole conductor v8 passes through the insulator layer 16i in the up-down direction to connect the downstream end of the coil conductor layer 18h and the upstream end of the coil conductor layer 18i. The via hole conductor v9 passes through the insulator layer 16j in the up-down direction to connect the downstream end of the coil conductor layer 18i and the upstream end of the coil conductor layer 18j. The via hole conductor v10 passes through the insulator layer 16k in the up-down direction to connect the downstream end of the coil conductor layer 18j and the upstream end of the coil conductor layer 18k.

The via hole conductors v11 to v13 pass through the insulator layers 16l to 16n in the up-down direction, and are connected to each other to provide a sequence of via hole conductors. The via hole conductors v11 to v13 connect the downstream end of the coil conductor layer 18k and the upstream end of the coil conductor layer 18l. The via hole conductor v14 passes through the insulator layer 16o in the up-down direction to connect the downstream end of the coil conductor layer 18l and the upstream end of the coil conductor layer 18m. The via hole conductor v15 passes through the insulator layer 16p in the up-down direction to connect the downstream end of the coil conductor layer 18m and the upstream end of the coil conductor layer 18n. The via hole conductor v16 passes through the insulator layer 16q in the up-down direction to connect the downstream end of the coil conductor layer 18n and the upstream end of the coil conductor layer 18o. The via hole conductor v17 passes through the insulator layer 16r in the up-down direction to connect the downstream end of the coil conductor layer 18o and the upstream end of the coil conductor layer 18p. The via hole conductor v18 passes through the insulator layer 16s in the up-down direction to connect the downstream end of the coil conductor layer 18p and the upstream end of the coil conductor layer 18q. The via hole conductor v19 passes through the insulator layer 16t in the up-down direction to connect the downstream end of the coil conductor layer 18q and the upstream end of the coil conductor layer 18r. The via hole conductor v20 passes through the insulator layer 16u in the up-down direction to connect the downstream end of the coil conductor layer 18r and the upstream end of the coil conductor layer 18s.

In the coil L1 described above, the coil conductor layers 18b and 18c define a loop with a relatively small diameter, while the coil conductor layers 18d and 18e define a loop with a relatively large diameter. Likewise, as for the coil conductor layers 18f to 18s, two coil conductor layers connected to each other define a loop with a relatively small diameter, while other two coil conductor layers connected to each other define a loop with a relatively large diameter. As a result, the diameter of the coil L1 changes to the relatively small one (an example of the first diameter) or to the relatively large one (an example of the second diameter) every time the coil L1 defines a loop.

The signal line SL1 includes the extended conductor layers 24a and 24b. The extended conductor layer 24a is a linear conductor layer provided on the front surface of the insulator layer 16b, and connects the upstream end of the coil conductor layer 18a and the outer electrode 14a. The extended conductor layer 24b is a linear conductor layer provided on the front surface of the insulator layer 16v, and connects the downstream end of the coil conductor layer 18s and the outer electrode 14b.

The coil L2 has a spiral shape including a winding axis extending in the up-down direction (not illustrated); in the present preferred embodiment, when viewed from the upper side, the coil L2 has a spiral shape extending forward from the upper side toward the lower side while looping in the counterclockwise direction. The winding axis of the coil L2 is positioned on an intersecting point of diagonal lines of the element body 12 when viewed from the upper side. The coil L2 loops along the coil L1. The coil L2 includes the coil conductor layers 20a to 20s (an example of a plurality of second coil conductor layers) and the via hole conductors v21 to v40 (an example of a second interlayer connection conductor).

The coil conductor layers 20a to 20s are linear conductor layers respectively provided on the front surfaces of the insulator layers 16b to 16l and 16o to 16v, and define trajectories R2 and R4 by overlapping with one another when viewed from the upper side, as illustrated in FIGS. 7 and 8. The trajectories R2 and R4 are each formed in a rectangular shape. Note that, however, the right half of each of the trajectories R2 and R4 is larger in size than the left half of each of the trajectories R2 and R4. In addition, a diameter of the trajectory R2 (an example of the second diameter) is larger than a diameter of the trajectory R4 (an example of the first diameter). The trajectory R4 is enclosed within the trajectory R2. The trajectories R2 and R4 are not circular, but are instead preferably rectangular. Because of this, an average value of distance from the center of gravity of each of the trajectories R2 and R4 to each of the trajectories R2 and R4 is taken as the diameter of each of the trajectories R2 and R4.

Each of the coil conductor layers 20a, 20e, 20i, 20o, and 20s is provided in the left half region on the front surface of each of the insulator layers 16b, 16f, 16j, 16r, and 16v. Each of the coil conductor layers 20a, 20e, 20i, 20o, and 20s loops in the counterclockwise direction from the vicinity of the center of a long side on the rear side of each of the insulator layers 16b, 16f, 16j, 16r, and 16v to the vicinity of the center of a long side on the front side of each of the insulator layers 16b, 16f, 16j, 16r, and 16v, and has a length equivalent to a half loop. Note that each of the coil conductor layers 20a, 20e, 20i, 20o, and 20s loops being positioned on an inner circumference side relative to each of the coil conductor layers 18a, 18e, 18i, 18o, and 18s. The coil conductor layers 20a, 20e, 20i, 20o, and 20s overlap with the left half of the trajectory R2, and each have a relatively large diameter (an example of the second diameter).

Each of the coil conductor layers 20d, 20h, 20n, and 20r is provided in the right half region on the front surface of each of the insulator layers 16e, 16i, 16q, and 16u. Each of the coil conductor layers 20d, 20h, 20n, and 20r loops in the counterclockwise direction from the vicinity of the center of a long side on the front side of each of the insulator layers 16e, 16i, 16q, and 16u to the vicinity of the center of a long side on the rear side of each of the insulator layers 16e, 16i, 16q, and 16u, and has a length equivalent to a half loop. Note that each of the coil conductor layers 20d, 20h, 20n, and 20r loops are positioned on an outer circumference side relative to each of the coil conductor layers 18d, 18h, 18n, and 18r. The coil conductor layers 20d, 20h, 20n, and 20r overlap with the right half of the trajectory R2, and each have a relatively large diameter (an example of the second diameter).

Each of the coil conductor layers 20c, 20g, 20k, 20m, and 20q is provided in the left half region on the front surface of each of the insulator layers 16d, 16h, 16l, 16p, and 16t. Each of the coil conductor layers 20c, 20g, 20k, 20m, and 20q loops in the counterclockwise direction from the vicinity of the center of a long side on the rear side of each of the insulator layers 16d, 16h, 16l, 16p, and 16t to the vicinity of the center of a long side on the front side of each of the insulator layers 16d, 16h, 16l, 16p, and 16t, and has a length equivalent to a half loop. Note that each of the coil conductor layers 20c, 20g, 20k, 20m, and 20q loops being positioned on the inner circumference side relative to each of the coil conductor layers 18c, 18g, 18k, 18m, and 18q. The coil conductor layers 20c, 20g, 20k, 20m, and 20q overlap with the left half of the trajectory R4, and each have a relatively small diameter (an example of the first diameter).

Each of the coil conductor layers 20b, 20f, 20j, 20l, and 20p is provided in the right half region on the front surface of each of the insulator layers 16c, 16g, 16k, 16o, and 16s. Each of the coil conductor layers 20b, 20f, 20j, 20l, and 20p loops in the counterclockwise direction from the vicinity of the center of a long side on the front side of each of the insulator layers 16c, 16g, 16k, 16o, and 16s to the vicinity of the center of a long side on the rear side of each of the insulator layers 16c, 16g, 16k, 16o, and 16s, and has a length equivalent to a half loop. Note that each of the coil conductor layers 20b, 20f, 20j, 20l, and 20p loops being positioned on the outer circumference side relative to each of the coil conductor layers 18b, 18f, 18j, 18l, and 18p. The coil conductor layers 20b, 20f, 20j, 20l, and 20p overlap with the right half of the trajectory R4, and each have a relatively small diameter (an example of the first diameter).

In the above-discussed coil conductor layers 20a to 20s, an end portion on the upstream side in the counterclockwise direction is referred to as an upstream end, and an end portion on the downstream side in the counterclockwise direction is referred to as a downstream end.

The via hole conductor v21 passes through the insulator layer 16b in the up-down direction to connect the downstream end of the coil conductor layer 20a and the upstream end of the coil conductor layer 20b. The via hole conductor v22 passes through the insulator layer 16c in the up-down direction to connect the downstream end of the coil conductor layer 20b and the upstream end of the coil conductor layer 20c. The via hole conductor v23 passes through the insulator layer 16d in the up-down direction to connect the downstream end of the coil conductor layer 20c and the upstream end of the coil conductor layer 20d. The via hole conductor v24 passes through the insulator layer 16e in the up-down direction to connect the downstream end of the coil conductor layer 20d and the upstream end of the coil conductor layer 20e. The via hole conductor v25 passes through the insulator layer 16f in the up-down direction to connect the downstream end of the coil conductor layer 20e and the upstream end of the coil conductor layer 20f. The via hole conductor v26 passes through the insulator layer 16g in the up-down direction to connect the downstream end of the coil conductor layer 20f and the upstream end of the coil conductor layer 20g. The via hole conductor v27 passes through the insulator layer 16h in the up-down direction to connect the downstream end of the coil conductor layer 20g and the upstream end of the coil conductor layer 20h. The via hole conductor v28 passes through the insulator layer 16i in the up-down direction to connect the downstream end of the coil conductor layer 20h and the upstream end of the coil conductor layer 20i. The via hole conductor v29 passes through the insulator layer 16j in the up-down direction to connect the downstream end of the coil conductor layer 20i and the upstream end of the coil conductor layer 20j. The via hole conductor v30 passes through the insulator layer 16k in the up-down direction to connect the downstream end of the coil conductor layer 20j and the upstream end of the coil conductor layer 20k.

Via hole conductors v31 to v33 pass through the insulator layers 16l to 16n in the up-down direction, and are connected to each other to provide a sequence of via hole conductors. The via hole conductors v31 to v33 connect the downstream end of the coil conductor layer 20k and the upstream end of the coil conductor layer 20l. The via hole conductor v34 passes through the insulator layer 16o in the up-down direction to connect the downstream end of the coil conductor layer 20l and the upstream end of the coil conductor layer 20m. The via hole conductor v35 passes through the insulator layer 16p in the up-down direction to connect the downstream end of the coil conductor layer 20m and the upstream end of the coil conductor layer 20n. The via hole conductor v36 passes through the insulator layer 16q in the up-down direction to connect the downstream end of the coil conductor layer 20n and the upstream end of the coil conductor layer 20o. The via hole conductor v37 passes through the insulator layer 16r in the up-down direction to connect the downstream end of the coil conductor layer 20o and the upstream end of the coil conductor layer 20p. The via hole conductor v38 passes through the insulator layer 16s in the up-down direction to connect the downstream end of the coil conductor layer 20p and the upstream end of the coil conductor layer 20q. The via hole conductor v39 passes through the insulator layer 16t in the up-down direction to connect the downstream end of the coil conductor layer 20q and the upstream end of the coil conductor layer 20r. The via hole conductor v40 passes through the insulator layer 16u in the up-down direction to connect the downstream end of the coil conductor layer 20r and the upstream end of the coil conductor layer 20s.

In the coil L2 described above, the coil conductor layers 20b and 20c define a loop with a relatively small diameter, while the coil conductor layers 20d and 20e define a loop with a relatively large diameter. Likewise, as for the coil conductor layers 20f to 20s, two coil conductor layers connected to each other define a loop with a relatively small diameter, while other two coil conductor layers connected to each other define a loop with a relatively large diameter. As a result, the diameter of the coil L2 changes to the relatively small one (an example of the first diameter) or to the relatively large one (an example of the second diameter) every time the coil L2 defines a loop.

A combination of the coil conductor layers 18a and 20a provided on the insulator layer 16b (an example of a first insulator layer) is called a first combination. Likewise, hereinafter, each combination of one of the coil conductor layers 18c, 18e, 18g, 18i, 18k, 18m, 18o, 18q, and 18s respectively provided on the insulator layers 16d, 16f, 16h, 16j, 16l, 16p, 16r, 16t, and 16v (an example of the first insulator layer) and one of the coil conductor layers 20c, 20e, 20g, 20i, 20k, 20m, 20o, 20q, and 20s respectively provided thereon is called the first combination. In the first combinations, the coil conductor layers 20a, 20c, 20e, 20g, 20i, 20k, 20m, 20o, 20q, and 20s loop being positioned on the inner circumference side relative to the coil conductor layers 18a, 18c, 18e, 18g, 18i, 18k, 18m, 18o, 18q, and 18s, respectively.

A combination of the coil conductor layers 18b and 20b provided on the insulator layer 16c (an example of a second insulator layer) is called a second combination. Likewise, hereinafter, each combination of one of the coil conductor layers 18d, 18f, 18h, 18j, 18l, 18n, 18p, and 18r respectively provided on the insulator layers 16e, 16g, 16i, 16k, 16l, 16q, 16s, and 16u (an example of the second insulator layer) and one of the coil conductor layers 20d, 20f, 20h, 20j, 20l, 20n, 20p, and 20r respectively provided thereon is called the second combination. In the second combinations, the coil conductor layers 20b, 20d, 20f, 20h, 20j, 20l, 20n, 20p, and 20r loop being positioned on the outer circumference side relative to the coil conductor layers 18b, 18d, 18f, 18h, 18j, 18l, 18n, 18p, and 18r, respectively.

The above-discussed first and second combinations are alternately arranged in the up-down direction. With this, a positional relationship between the coil L1 and the coil L2 is such that the positions of the coils L1 and L2 are exchanged between the inner circumference side and the outer circumference side every half loop.

The signal line SL2 includes the extended conductor layers 26a and 26b. The extended conductor layer 26a is a linear conductor layer provided on the front surface of the insulator layer 16b, and connects the upstream end of the coil conductor layer 20a and the outer electrode 14c. The extended conductor layer 26b is a linear conductor layer provided on the front surface of the insulator layer 16v, and connects the downstream end of the coil conductor layer 20s and the outer electrode 14d.

The coil L3 has a spiral shape including a winding axis extending in the up-down direction (not illustrated); in the present preferred embodiment, when viewed from the upper side, the coil L3 has a spiral shape extending forward from the upper side toward the lower side while looping in the counterclockwise direction. The winding axis of the coil L3 is positioned on an intersecting point of diagonal lines of the element body 12 when viewed from the upper side. The coil L3 preferably includes the coil conductor layers 30a and 30b (an example of a third coil conductor layer) and the via hole conductor v50 (an example of a third interlayer connection conductor).

The coil conductor layer 30a is a linear conductor layer provided on the front surface of the insulator layer 16m, and preferably has an eddy shape extending from the inner circumference side toward the outer circumference side while looping in the counterclockwise direction when viewed from the upper side. The coil conductor layer 30b is a linear conductor layer provided on the front surface of the insulator layer 16n, and preferably has an eddy shape extending from the outer circumference side toward the inner circumference side while looping in the counterclockwise direction when viewed from the upper side. In the above-discussed coil conductor layers 30a, an end portion on the upstream side in the counterclockwise direction is referred to as an upstream end t2, and an end portion on the downstream side in the counterclockwise direction is referred to as a downstream end t1. In the above-discussed coil conductor layers 30b, an end portion on the upstream side in the counterclockwise direction is referred to as an upstream end t3, and an end portion on the downstream side in the counterclockwise direction is referred to as a downstream end t4.

The width of the upstream end t2 (an example of a second end portion) of the coil conductor layer 30a is larger than the width of the downstream end t1 and the width of a portion excluding the upstream end t2 of the coil conductor layer 30a. Likewise, the width of the downstream end t4 (an example of the second end portion) of the coil conductor layer 30b is larger than the width of the upstream end t3 and the width of a portion excluding the downstream end t4 of the coil conductor layer 30b. The upstream end t2 and the downstream end t4 oppose each other with the insulator layer 16m interposed therebetween. With this, capacitance is generated between the upstream end t2 and the downstream end t4. Further, the portion excluding the upstream end t2 of the coil conductor layer 30a and the portion excluding the downstream end portion t4 of the coil conductor layer 30b oppose each other with the insulator layer 16m interposed therebetween. With this, capacitance is generated between the portion excluding the upstream end t2 of the coil conductor layer 30a and the portion excluding the downstream end t4 of the coil conductor layer 30b. The capacitor C1 is the total of these two capacitances, and is capacitance generated between the coil conductor layer 30a and the coil conductor layer 30b. The "width" here refers to the width of the coil conductor layers 30a and 30b in a direction perpendicular or substantially perpendicular to a direction in which each of the coil conductor layers 30a and 30b extends.

Further, the upstream end t2 and the downstream end t4 do not overlap with the center of a region surrounded by the coils L1 and L2 (in other words, the winding axis of each of the coils L1 and L2) when viewed from the upper side. In the present preferred embodiment, the upstream end t2 and the downstream end t4 are positioned on the right side relative to the winding axis of each of the coils L1 and L2.

The via hole conductor v50 passes through the insulator layer 16m in the up-down direction to connect the downstream end t1 (an example of a first end portion) of the coil conductor layer 30a and the upstream end t3 (an example of the first end portion) of the coil conductor layer 30b (an example of the first end portions connected to each other).

The via hole conductors v11 to v13 and v31 to v33 pass through in the up-down direction between a portion on the inner circumference side of the coil conductor layers 30a and 30b and a portion on the outer circumference side of the coil conductor layers 30a and 30b.

In the common mode choke coil 10 discussed above, the coil L3 is held between the coils L1 and L2 at both sides of the coil L3 in the up-down direction. To be specific, the coil L1 includes coil sections Lp1 and Lp2. The coil section Lp1 corresponds to the coil conductor layers 18a to 18k and the via hole conductors v1 to v10. In other words, the coil section Lp1 (an example of a first coil section) is a section positioned on the upper side relative to the coil L3 (an example of one side in the first direction). The coil section Lp2 (an example of a second coil section) corresponds to the coil conductor layers 18l to 18s and the via hole conductors v14 to v20. In other words, the coil section Lp2 is a section positioned on the lower side relative to the coil L3 (an example of the other side in the first direction).

The coil L2 includes coil sections Lp3 and Lp4. The coil section Lp3 (an example of a third coil section) corresponds to the coil conductor layers 20a to 20k and the via hole conductors v21 to v30. In other words, the coil section Lp3 is a section positioned on the upper side relative to the coil L3 (an example of one side in the first direction). The coil section Lp4 (an example of a fourth coil section) corresponds to the coil conductor layers 20l to 20s and the via hole conductors v34 to v40. In other words, the coil section Lp4 is a section positioned on the lower side relative to the coil L3 (an example of the other side in the first direction). As discussed above, the coil sections Lp1 and Lp3 are positioned on the upper side relative to the coil L3 and the coil sections Lp2 and Lp4 are positioned on the lower side relative to the coil L3, such that the coil L3 is positioned in the vicinity of the center of the element body 12 in the up-down direction.

The above-discussed coil conductor layers 18a to 18s, 20a to 20s, 30a and 30b, and the extended conductor layers 24a, 24b, 26a and 26b are preferably defined by the insulator layers 16b to 16v being coated with a conductive paste whose main ingredient is metal such as copper, for example. The via hole conductors v1 to v40 and v50 are preferably defined by the via holes passing through the insulator layers 16b to 16u in the up-down direction being filled with a conductive paste whose main ingredient is metal such as copper, for example.

Next, operations of the common mode choke coil 10 will be described. The outer electrodes 14a and 14c are used as input terminals, for example. The outer electrodes 14b and 14d are used as output terminals, for example.

A differential transmission signal including a first signal and a second signal having different phases from each other by 180 degrees is inputted to the outer electrodes 14a and 14c. Since the first signal and the second signal are in the differential mode, magnetic fluxes in opposite directions to each other are generated in the coils L1 and L2 when the signals pass through the coils L1 and L2. The magnetic flux generated in the coil L1 and the magnetic flux generated in the coil L2 cancel each other out. Because of this, an increase or decrease in magnetic flux is barely generated in the coils L1 and L2 due to the first signal and the second signal flowing therethrough. That is to say, none of the coils L1 and L2 generate back electromotive force that obstructs the flow of the first signal and the second signal. Accordingly, the common mode choke coil 10 only has a considerably small impedance with respect to the first signal and the second signal.

Meanwhile, in a case where common mode noise is contained in the first signal and the second signal, the common mode noise causes the coils L1 and L2 to generate magnetic fluxes in the same direction when the noise passes through the coils L1 and L2. Because of this, the magnetic flux increases inside the coils L1 and L2 due to the common mode noise flowing therethrough. With this, the coils L1 and L2 generate back electromotive force that obstructs the flow of the common mode noise. Accordingly, the common mode choke coil 10 has large impedance with respect to the common mode noise.

The above-discussed common mode choke coil 10 has two attenuation poles in the bandpass characteristics (Scc21) of common mode noise in the operating frequency band. The frequencies of the two attenuation poles are respectively defined as frequencies fa and fb. The frequency fb is higher than the frequency fa. At this time, the resonant frequency f1 of the main circuit MC and the resonant frequency f2 of the parallel resonance circuit LC are no less than fa and no more than fb. For example, in a case where the common mode choke coil 10 is used for a differential transmission line of USB3.0 and USB3.1, the frequency fa is 2.5 GHz which is the fundamental frequency of USB3.0 (data transfer speed is 5.0 Gbps), and the frequency fb is 5.0 GHz which is the fundamental frequency of USB3.1 (data transfer speed is 10.0 Gbps). In other words, the common mode choke coil 10 removes the common mode noise at a frequency of 2.5 GHz (the frequency fa) and the common mode noise at a frequency of 5.0 GHz (the frequency fb) from a differential transmission signal.

Figure 9:
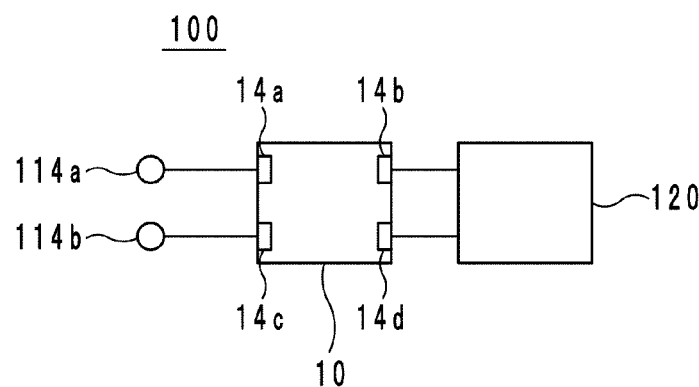
FIG. 9 is a block diagram of an electronic apparatus 100 according to a preferred embodiment of the present invention.

Next, the electronic apparatus 100 according to another preferred embodiment of the present invention in which the common mode choke coil 10 is used will be described with reference to the drawings. FIG. 9 is a block diagram of the electronic apparatus 100.

The electronic apparatus 100 is preferably, for example, a personal computer, a cellular phone, or the like, and includes the common mode choke coil 10, outer electrodes 114*a* and 114*b*, and an interface IC 120 (which is an example of an electric circuit according to a preferred embodiment of the present invention). The outer electrodes 114*a* and 114*b* are electrically connected to the outer electrodes 14*a* and 14*c*, respectively. Further, the outer electrodes 14*b* and 14*d* are electrically connected to the interface IC 120. In other words, the signal lines SL1 and SL2 are connected to the interface IC 120 through the outer electrodes 14*b* and 14*d*. The interface IC 120 is, for example, a USB transceiver IC.

In the above-discussed electronic apparatus 100, the common mode choke coil 10 removes common mode noise from a differential transmission signal inputted to the interface IC, or removes common mode noise from a differential transmission signal outputted from the interface IC.

Next, a non-limiting example of a manufacturing method for the common mode choke coil 10 will be described with reference to the drawings.

First, ceramic green sheets to become the insulator layers 16*a* to 16*w* illustrated in FIGS. 3 and 4 are prepared. Specifically, ceramic green sheets with a thickness of about 20 μm to become the insulator layers 16*a* to 16*w* are prepared using a doctor blade method in which ceramic slurry of LTCC has a sheet shape on a carrier sheet and dried.

Next, via holes are formed by radiating laser beams onto the positions, where the via hole conductors v1 to v40 and v50 are to be formed, in the ceramic green sheets to become the insulator layers 16*b* to 16*u*, as illustrated in FIGS. 3 and 4. Subsequently, the via holes are filled with a conductive paste whose main ingredient is copper by a method such as print application, for example.

Next, as illustrated in FIGS. 3 and 4, the coil conductor layers 18*a* to 18*s*, 20*a* to 20*s*, 30*a* and 30*b*, and the extended conductor layers 24*a*, 24*b*, 26*a* and 26*b* are formed on the front surfaces of the ceramic green sheets to become the insulator layers 16*b* to 16*v*. To be specific, the conductive paste whose main ingredient is copper is applied, using a method such as a screen printing method or a photolithography method, onto the front surfaces of the ceramic green sheets to become the insulator layers 16*b* to 16*v*, thus forming the coil conductor layers 18*a* to 18*s*, 20*a* to 20*s*, 30*a* and 30*b*, and the extended conductor layers 24*a*, 24*b*, 26*a* and 26*b*. A process of forming the coil conductor layers 18*a* to 18*s*, 20*a* to 20*s*, 30*a* and 30*b*, and the extended conductor layers 24*a*, 24*b*, 26*a* and 26*b*, and a process of filling the conductive paste into the via holes may be carried out in the same process.

Next, as illustrated in FIGS. 3 and 4, the ceramic green sheets to become the insulator layers 16*a* to 16*w* are laminated and pressure-bonded so as to be arranged in that order, thus obtaining a mother multilayer body before being fired. The lamination and pressure bonding of the ceramic green sheets to become the insulator layers 16*a* to 16*w* is carried out in the following manner: the ceramic green sheets are laminated, one after another, and temporarily pressure-bonded to obtain a mother element body; and thereafter the main pressure-bonding is carried out by pressing the mother element body before being fired by the isostatic press or the like, for example.

Next, the mother element body is cut into the element body 12 of a predetermined dimension using a cutting blade. With this, the element body 12 before being fired is obtained. Debinding processing and firing are performed on the element body 12 before being fired.

Next, barrel polishing processing is performed on the element body 12 to chamfer it. Further, the underlying electrodes of the outer electrodes 14*a* to 14*d* are preferably formed by applying the conductive paste, whose main ingredient is copper, onto the element body 12. Then, Ni plating and Sn plating are applied on the underlying electrodes, thus forming the outer electrodes 14*a* to 14*d*. Through the above-discussed processes, the common mode choke coil 10 as illustrated in FIG. 2 is completed.

Figure 10:
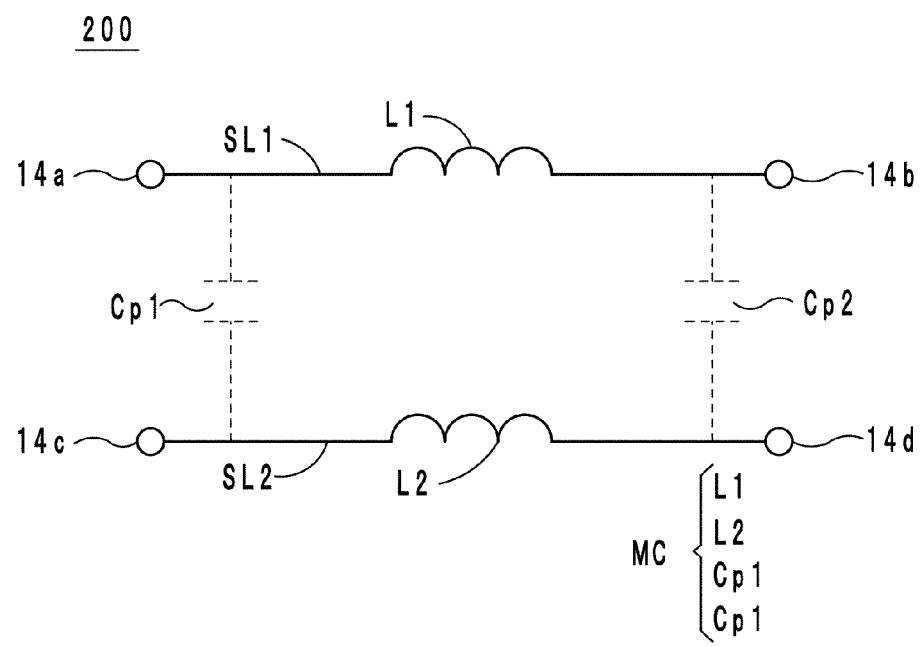
FIG. 10 is an equivalent circuit diagram of a common mode choke coil 200 according to a comparative example of the present invention.
Figure 11:
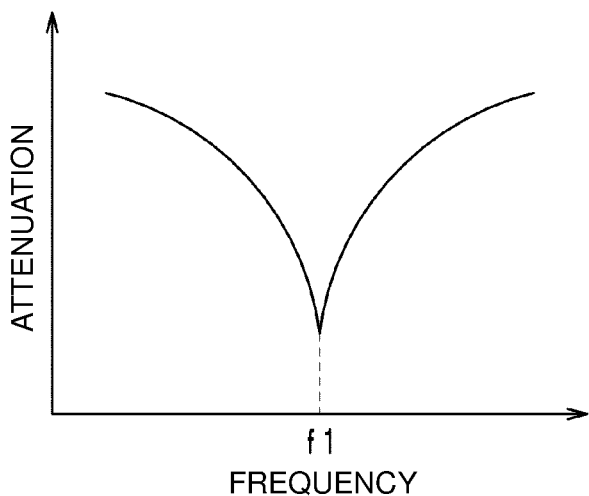
FIG. 11 is a graph showing bandpass characteristics (Scc21) of common mode noise of the common mode choke coil 200.
Figure 12:
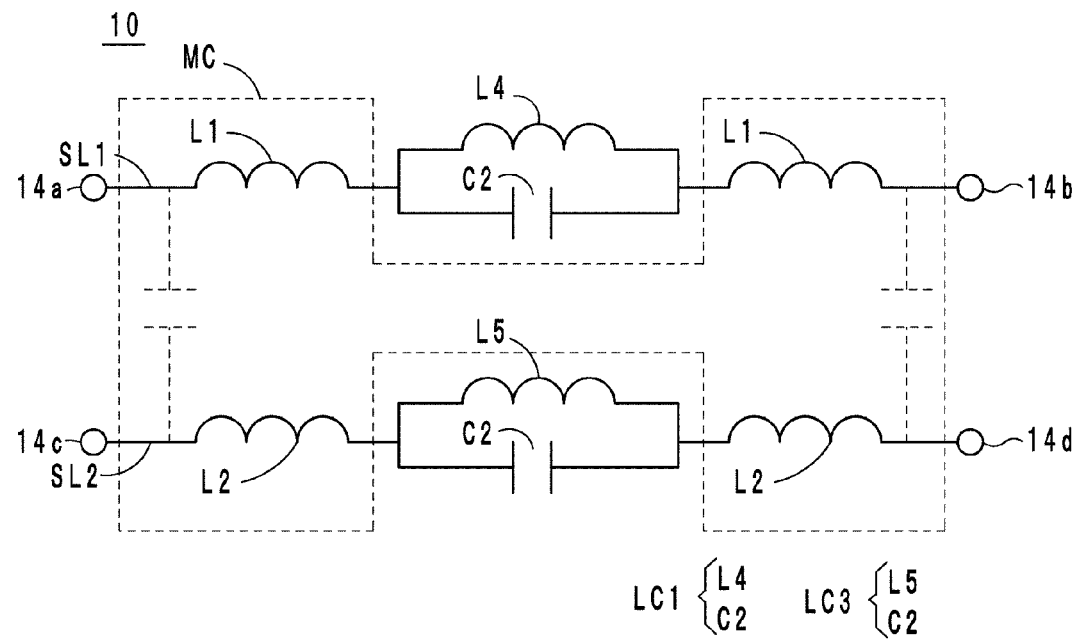
FIG. 12 is an equivalent circuit diagram explaining the common mode choke coil 10.
Figure 13:
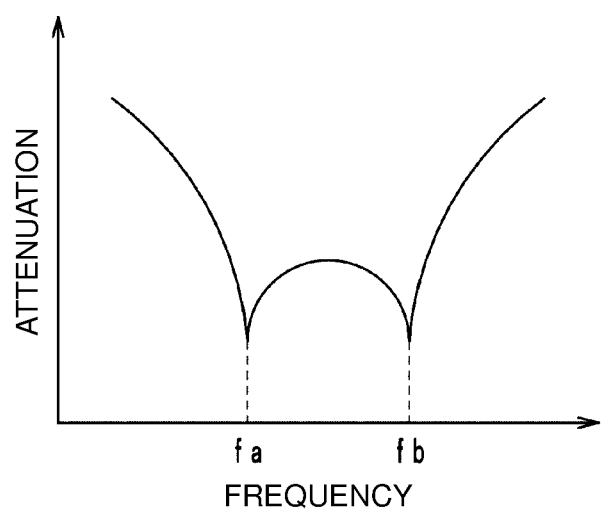
FIG. 13 is a graph showing bandpass characteristics (Scc21) of common mode noise of the common mode choke coil 10.

With the common mode choke coil 10 according to a preferred embodiment of the present invention, a plurality of attenuation poles are provided and transmission loss is decreased, as described below. FIG. 10 is an equivalent circuit diagram of the common mode choke coil 200 according to a comparative example of the present invention. FIG. 11 is a graph showing bandpass characteristics (Scc21) of common mode noise of the common mode choke coil 200. FIG. 12 is an equivalent circuit diagram explaining the common mode choke coil 10. FIG. 13 is a graph showing bandpass characteristics (Scc21) of common mode noise of the common mode choke coil 10. In each of FIGS. 11 and 13, the vertical axis represents attenuation and the horizontal axis represents a frequency.

The common mode choke coil 200, illustrated in FIG. 10, according to the comparative example differs from the common mode choke coil 10 in a point that the parallel resonance circuit LC is not provided therein. Because other constituent elements of the common mode choke coil 200 are preferably the same as those of the common mode choke coil 10, descriptions thereof are omitted herein. Further, in the common mode choke coil 200, elements common to the common mode choke coil 10 and the common mode choke coil 200 are assigned the identical reference signs.

The common mode choke coil 200 includes the main circuit MC. Accordingly, the frequency of an attenuation pole of the common mode choke coil 200 is the frequency f1 as shown in FIG. 11. In this manner, only one attenuation pole is able to be achieved in the two coils L1 and L2.

As such, the inventors of preferred embodiments of the present invention took an inventive approach and discovered that two attenuation poles including the frequencies fa and fb are able to be achieved by constructing the common mode choke coil 10 in a novel manner in which the frequency f1 and frequency f2 become equal or substantially equal to each other, as described below.

The coils L1 and L2, and the parasitic capacitance Cp1 and Cp2 define a common mode filter that removes the common mode at the frequency f1. At this time, the coil L1 and the coil L2 strengthen a magnetic field together and resonate at the frequency f1. A parallel resonator that includes the coil L3 and the capacitor C1 and resonates near the frequency f1 is so disposed as to obstruct the magnetic field. In this case, a resonance circuit including the coil L3 and the capacitor C1 receives magnetic field energy produced by the coils L1 and L2, and resonates. As a result, such a magnetic field is generated that obstructs the magnetic field by the coils L1 and L2. Because of this, at a frequency equal to or larger than the resonant frequency brought by the coil L3 and the capacitor C1, the magnetic field of the coil L1 and coil L2 is isolated by the coil L3 and the capacitor C1. With this, the values of the coil L1 and the coil L2 are reduced by about half, and new resonance is able to be observed at the frequency f2. The inductance value causing the isolation of the coils L1 and L2 is changed by changing the position of the resonator configured with the coil L3 and the capacitor C1 in a sheet direction. With this, if the resonator is disposed at a position where the coils L1 and L2 are isolated at a ratio of one to three, for example, two resonance points are able to be achieved (one more frequency in addition to the frequency f2).

The coil L3 is connected to the coils L1 and L2 by magnetic field coupling. Due to such magnetic field coupling, it can be considered that the coil L1 and a parallel resonance circuit LC1 are connected in series, and that the coil L2 and a parallel resonance circuit LC2 are connected in series, as illustrated in FIG. 12. The parallel resonance circuit LC1 includes a coil L4 and a capacitor C2 connected in parallel. The parallel resonance circuit LC2 includes a coil L5 and the capacitor C2 are connected in parallel. The inductance value of the coil L4 is determined by the inductance values of the coils L1 and L3, the degree of coupling with the coils L1 and L3, and the like. The inductance value of the coil L5 is determined by the inductance values of the coils L2 and L3, the degree of coupling with the coils L2 and L3, and the like. In the present preferred embodiments, it is considered that the inductance value of the coil L4 equals the inductance value of the coil L5. In this case, the resonant frequency of the parallel resonance circuits LC1 and LC2 is the frequency fb (5.0 GHz). Accordingly, the common mode choke coil 200 generates large impedance with respect to the common mode noise of the frequency fb (5.0 GHz).

In addition, the coils L1 and L2 are connected to the coil L3 by magnetic field coupling. This makes the inductance values of the coils L1 and L2 be affected by the magnetic field coupling. Due to this, the resonant frequency of the main circuit MC also varies from the frequency f1 to the frequency fa (i.e., 2.5 GHz). For the above-described reason, the common mode choke coil 10 includes two attenuation poles in the bandpass characteristics of common mode noise.

Further, the common mode choke coil 10 is provided with a single coil L1 between the outer electrode 14a and the outer electrode 14b, and is provided with a single coil L2 between the outer electrode 14c and the outer electrode 14d. Therefore, in the common mode choke coil 10, unlike the common mode filter 500 disclosed in Japanese Unexamined Patent Application Publication No. 2012-195332, it is unnecessary to connect the coils 502 and 504 in series and it is also unnecessary to connect the coils 506 and 508 in series. As a result, an increase in the DC resistance value is significantly reduced or prevented, and an increase in the transmission loss is also significantly reduced or prevented in the common mode choke coil 10.

In addition, the common mode choke coil 10 is able to be miniaturized. More specifically, in the common mode filter 500 disclosed in Japanese Unexamined Patent Application Publication No. 2012-195332, attenuation poles are provided with capacitance between the coil 502 and the coil 504, and capacitance between the coil 506 and the coil 508. In the common mode filter 500, since the coupling coefficient between the first filter section configured of the coils 502, 506 and the second filter section configured of the coils 504, 508 is small, the capacitance between the coil 502 and coil 504, and the capacitance between the coil 506 and coil 508 become small. This undesirably raises the attenuation pole frequency of the common mode filter 500. As such, it is necessary to lower the attenuation pole frequency to a desired frequency by increasing the inductance values of the coils 502, 504, 506, and 508. This raises a problem that the common mode filter 500 becomes large in size.

As such, in the common mode choke coil 10, a capacitor C3 is provided with two capacitances: a first capacitance generated by the coil conductor layer 30a and the coil conductor layer 30b opposing each other and a second capacitance generated between the upstream end t2 of the coil conductor layer 30a and the downstream end t4 of the coil conductor layer 30b. With this, the capacitor C3 has a large capacitance value. As a result, an increase in size of the coil L2 is significantly reduced or prevented so that the common mode choke coil 10 is miniaturized.

In addition, decreases in inductance values of the coils L1 and L2 are able to be significantly reduced or prevented in the common mode choke coil 10. Magnetic flux density becomes high near the winding axis of each of the coils L1 and L2. Due to this, it is not preferable to dispose, near the winding axis of each of the coils L1 and L2, such a conductor that obstructs the magnetic field. As such, in the common mode choke coil 10, the upstream end t2 and the downstream end t4 do not overlap with the center of a region surrounded by the coils L1 and L2 (in other words, the winding axis of each of the coils L1 and L2) when viewed from the upper side. With this, the decreases in inductance values of the coils L1 and L2 are significantly reduced or prevented.

Figure 14:
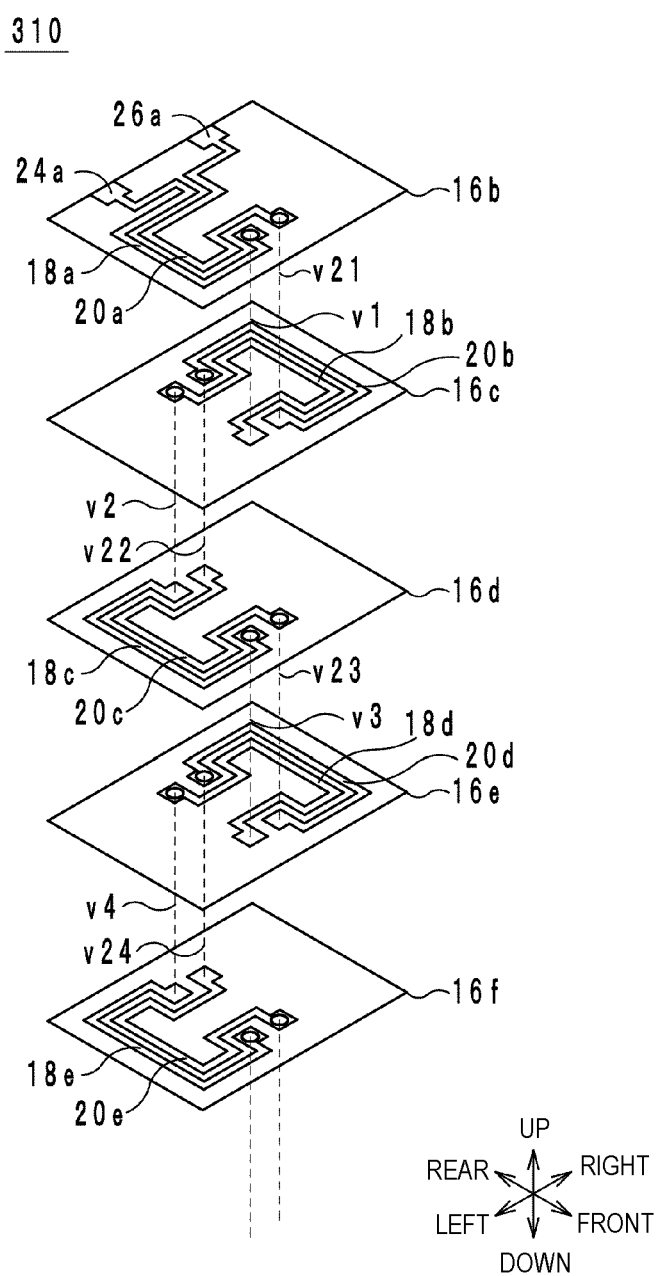
FIG. 14 is a partially exploded perspective view of a common mode choke coil 310 according to a working example of a preferred embodiment of the present invention.
Figure 15A:
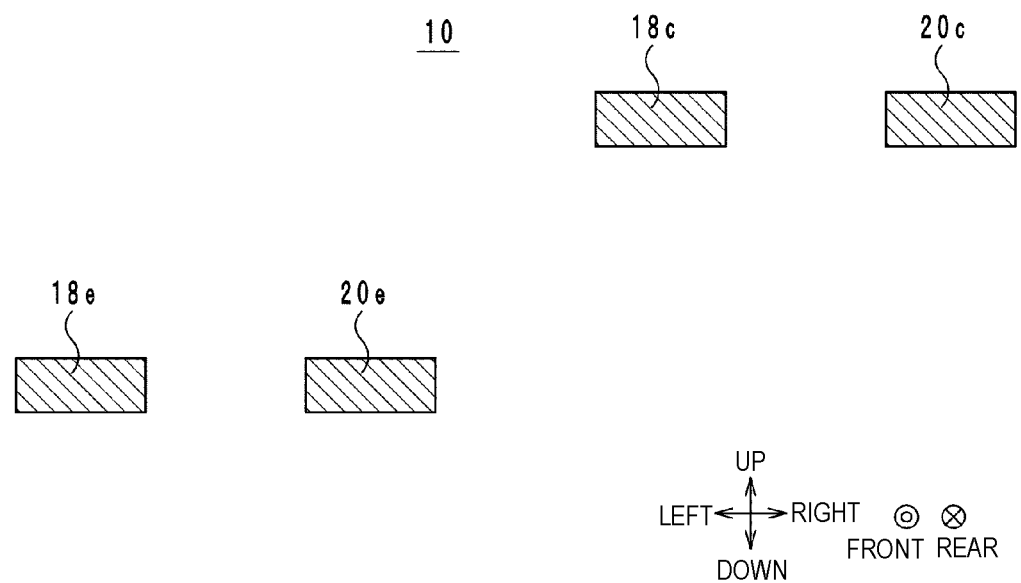
FIG. 15A is a cross-sectional structure view of the common mode choke coil 10.
Figure 15B:
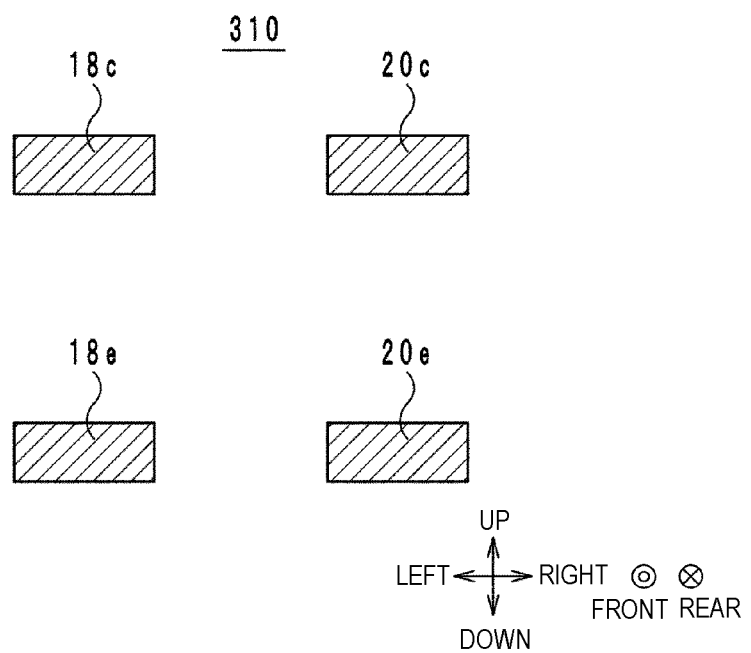
FIG. 15B is a cross-sectional structure view of the common mode choke coil 310.
Figure 16:
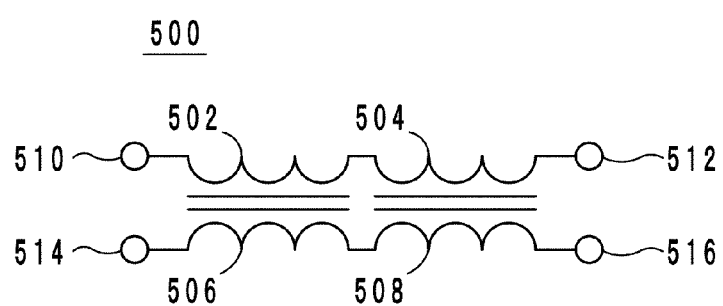
FIG. 16 is an equivalent circuit diagram of the common mode filter 500 disclosed in Japanese Unexamined Patent Application Publication No. 2012-195332.

Moreover, in the common mode choke coil 10, the generation of large capacitance between the coil L1 and the coil L2 is significantly reduced or prevented. Hereinafter, as a working example, a common mode choke coil in which the diameter of a coil L1 and the diameter of a coil L2 are uniform is cited as an example and explained. FIG. 14 is a partially exploded perspective view of the common mode choke coil 310 according to the working example. FIG. 15A is a cross-sectional structure view of the common mode choke coil 10. FIG. 15B is a cross-sectional structure view of the common mode choke coil 310.

The common mode choke coil 310 according to the working example is also included in a concept of the common mode choke coil according to a preferred embodiment of the present invention. In the common mode choke coil 310 according to the working example, constituent elements corresponding to those of the common mode choke coil 10 are assigned the identical reference signs.

As illustrated in FIG. 14, in the common mode choke coil 310, the coil conductor layers 18c and 20c preferably have the same shape as the coil conductor layers 18e and 20e, for example. Then, two layers including the insulator layers 16d and 16e are present between the coil conductor layers 18c and 20c and the coil conductor layers 18e and 20e. With this, as illustrated in FIG. 15B, the coil conductor layer 18c is made close to the coil conductor layer 20e, and the coil conductor layer 20c is made close to the coil conductor layer 18e. Because of this, large capacitance is generated between the coil L1 and the coil L2.

In contrast, in the common mode choke coil 10, the diameter of the coil L1 and the diameter of the coil L2 change to a relatively small one or to a relatively large one every time the coil L1 and coil L2 define a loop. Due to this, as illustrated in FIG. 15A, a distance between the coil conductor layer 18c and the coil conductor layer 20e in the common mode choke coil 10 is equal or substantially equal to a distance between the coil conductor layer 18c and the coil conductor layer 20e in the common mode choke coil 310. On the other hand, a distance between the coil conductor layer 18e and the coil conductor layer 20c in the common mode choke coil 10 is longer than a distance between the coil conductor layer 18e and the coil conductor layer 20c in the common mode choke coil 310. Accordingly, the capacitance generated between the coil L1 and the coil L2 in the common mode choke coil 10 is smaller than the capacitance generated between the coil L1 and the coil L2 in the common mode choke coil 310. As discussed so far, the generation of large capacitance between the coil L1 and the coil L2 is significantly reduced or prevented in the common mode choke coil 10.

Moreover, in the common mode choke coil 10, the structure of the coil L1 and the structure of the coil L2 are able to be made similar to each other. To be more specific, in the common mode choke coil 10, the first combinations and the second combinations are alternately arranged in the up-down direction. In the first combinations, the coil conductor layers 20a, 20c, 20e, 20g, 20i, 20k, 20m, 20o, 20q, and 20s loop being positioned on the inner circumference side relative to the coil conductor layers 18a, 18c, 18e, 18g, 18i, 18k, 18m, 18o, 18q, and 18s, respectively. In the second combinations, the coil conductor layers 20b, 20d, 20f, 20h, 20j, 20l, 20n, 20p, and 20r loop being positioned on the outer circumference side relative to the coil conductor layers 18b, 18d, 18f, 18h, 18j, 18l, 18n, 18p, and 18r, respectively. With this, a positional relationship between the coil L1 and the coil L2 is such that the positions of the coils L1 and L2 are exchanged between the inner circumference side and the outer circumference side every half loop. Due to this, the length of the coil L1 and the length of the coil L2 become close in size to each other, so that the structure of the coil L1 and the structure of the coil L2 become similar to each other.

As a result, when common mode noise is inputted to the coils L1 and L2, the strength of a magnetic field generated by the coil L1 due to the common mode noise becomes close to the strength of a magnetic field generated by the coil L2 due to the common mode noise. As such, these magnetic fields cancel out each other, thus making it possible to effectively remove the common mode noise.

In addition, the common mode choke coil 10 is able to be free of directionality. More specifically, the coil sections Lp1 and Lp3 are positioned on the upper side of the coil L3 and the coil sections Lp2 and Lp4 are positioned on the lower side of the coil L3, such that the coil L3 is positioned in the vicinity of the center of the element body 12 in the up-down direction. With this, the structure of an upper side portion relative to the coil L3 (the coil sections Lp1 and Lp3) and the structure of a lower side portion relative to the coil L3 (the coil sections Lp2 and Lp4) are able to be made similar to each other. As a result, characteristics of the common mode choke coil 10 when the outer electrodes 14a and 14c are used as input terminals and characteristics of the common mode choke coil 10 when the outer electrodes 14b and 14d are used as the input terminals, are able to be made similar to each other. This makes the common mode choke coil 10 free of directionality. Due to this, it is unnecessary to provide a direction identification mark on the upper surface of the element body 12. Note that, however, the above description is not intended to prevent the provision of the direction identification mark.

Further, with the common mode choke coil 10, both the upper surface and the lower surface of the element body 12 are able to be used as a mounting surface opposing the circuit board. More specifically, the coil sections Lp1 and Lp3 are positioned on the upper side of the coil L3 and the coil sections Lp2 and Lp4 are positioned on the lower side of the coil L3, such that the coil L3 is positioned in the vicinity of the center of the element body 12 in the up-down direction. With this, the structure of an upper side portion relative to the coil L3 (the coil sections Lp1 and Lp3) and the structure of a lower side portion relative to the coil L3 (the coil sections Lp2 and Lp4), can be made similar to each other. As such, characteristics of the common mode choke coil 10 when the upper surface of the element body 12 is taken as a mounting surface and characteristics of the common mode choke coil 10 when the lower surface of the element body 12 is taken as a mounting surface, are able to be made similar to each other. Accordingly, with the common mode choke coil 10, both the upper surface and the lower surface of the element body 12 can be used as the mounting surface opposing the circuit board. As a result, it is unnecessary to provide a direction identification mark on the upper surface or the bottom surface of the element body 12. Note that, however, the above description is not intended to prevent the provision of the direction identification mark.

Moreover, in the common mode choke coil 10, a phenomenon high frequency signals flowing through the via hole conductors v11 to v13 and v31 to v33 being affected by the magnetic field of the coil L3 is significantly reduced or prevented. To be more specific, between a portion on the inner circumference side of the coil conductor layers 30a and 30b and a portion on the outer circumference side of the coil conductor layers 30a and 30b, magnetic fields generated in these portions cancel out each other. Then, the via hole conductors v11 to v13 and v31 to v33 pass through in the up-down direction between the portion on the inner circumference side of the coil conductor layers 30a and 30b and the portion on the outer circumference side of the coil conductor layers 30a and 30b. As a result, phenomenon high frequency signals flowing through the via hole conductors v11 to v13 and v31 to v33 being affected by the magnetic field of the coil L3 is significantly reduced or prevented.

Other Preferred Embodiments

The common mode choke coils and the electronic apparatuses according to preferred embodiments of the present invention, in addition to the common mode choke coils 10, 310, and the electronic apparatus 100 according to the above preferred embodiments, can be modified within the scope of the spirit of the present invention.

Although the common mode choke coils 10 and 310 are prepared by a sequential pressure-bonding method, they may be prepared by another method such as a printing method or a photolithography method, for example. The printing method is a method in which the ceramic slurry application and the conductive paste application are alternately repeated. The photolithography method is a method in which the insulator layers 16a to 16w made of resin are formed by the photolithography method.

Although LTCC is taken as the material of the insulator layers 16a to 16w, a material other than LTCC such as resin material may be used. As the material of the insulator layers 16a to 16w, a magnetic material such as a ferrite may be used. However, in the case where a magnetic material is used, loss is likely to be increased in a high frequency band; therefore, it is preferable to use, as the material of the insulator layers 16a to 16w, a nonmagnetic material in which loss is unlikely to be generated in a high frequency band.

Note that the resonant frequencies used in the common mode choke coil 10 are merely examples, and other frequencies may be used.

The widths of the upstream end t2 and the downstream end t4 of the coil conductor layers 30a and 30b may be equal to the widths of the portions other than the upstream end t2 and the downstream end t4 of the coil conductor layers 30a and 30b.

The expression that the frequency f1 and the frequency f2 are equal or substantially equal to each other refers to a concept including a case in which the frequency f1 and the frequency f2 match each other and a case in which a difference between the frequency f1 and the frequency f2 is about several hundred MHz. Note that, however, if the frequency f1 and the frequency f2 fall at least within a range from no less than the frequency fa to no more than the frequency fb, it is that the frequency f1 and the frequency f2 are equal or substantially equal to each other.

Although one parallel resonance circuit LC is provided in the common mode choke coil 10, two or more parallel resonance circuits LC may be provided. The coil L3 of each of two or more parallel resonance circuits LC is connected to the coils L1 and L2 by magnetic field coupling. This makes it possible to form three or more attenuation poles in the bandpass characteristics of common mode noise.

As discussed thus far, preferred embodiments of the present invention are useful for common mode choke coils and electronic apparatuses, and are particularly excellent in a point that a plurality of attenuation poles is provided and transmission loss is able to be significantly reduced or prevented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A common mode choke coil comprising:
a differential transmission line including a first signal line and a second signal line;
a main circuit including a first coil provided in the first signal line, and a second coil provided in the second signal line and connected to the first coil by magnetic field coupling; and
a parallel resonance circuit including a third coil connected to both the first coil and the second coil by magnetic field coupling, and a first capacitor electrically connected in parallel to the third coil; wherein
a first resonant frequency of the main circuit is equal or substantially equal to a second resonant frequency of the parallel resonance circuit.

2. The common mode choke coil according to claim 1, further comprising:
an element body including a plurality of base material layers laminated in a first direction; wherein
the first coil, the second coil, the third coil, and the first capacitor are defined by conductor layers provided in or on the base material layers.

3. The common mode choke coil according to claim 2, wherein
each of the first coil, the second coil, and the third coil has a spiral shape including a winding axis extending in the first direction;
the first coil includes a first coil section positioned on a first side in the first direction relative to the third coil, and a second coil section positioned on a second side in the first direction relative to the third coil; and
the second coil includes a third coil section positioned on the first side in the first direction relative to the third coil, and a fourth coil section positioned on the second side in the first direction relative to the third coil.

4. The common mode choke coil according to claim 2, wherein
the first coil and the second coil define a loop along each other; and
each of a diameter of the first coil and a diameter of the second coil changes to a first diameter or to a second diameter larger than the first diameter, every time the first coil and the second coil define a loop.

5. The common mode choke coil according to claim 2, wherein
the plurality of base material layers include a first base material layer and a second base material layer;
the first coil and the second coil loop along each other;
the first coil includes a plurality of first coil conductor layers and one or more first interlayer connection conductors connecting the plurality of first coil conductor layers;
the second coil includes a plurality of second coil conductor layers and one or more second interlayer connection conductors connecting the plurality of second coil conductor layers;
the plurality of first coil conductor layers and the plurality of second coil conductor layers have a length equivalent to a half loop;
a first combination of one of the first coil conductor layers and one of the second coil conductor layers provided on the first base material layer, and a second combination of one of the first coil conductor layers and one of the second coil conductor layers provided on the second base material layer are alternately arranged in the first direction;

the second coil conductor layer loops being positioned on an inner circumference side relative to the first coil conductor layer in the first combination; and the second coil conductor layer loops being positioned on an outer circumference side relative to the first coil conductor layer in the second combination.

6. The common mode choke coil according to claim 2, wherein the third coil includes two third coil conductor layers opposing each other with the base material layer interposed between the third coil conductor layers; and the first capacitor is defined by a capacitance between the two third coil conductor layers.

7. The common mode choke coil according to claim 2, wherein the third coil includes two third coil conductor layers each including a first end portion and a second end portion and a third interlayer connection conductor;

the third interlayer connection conductor passes through at least one of the base material layers in the first direction to connect the first end portions of the two third coil conductor layers to each other;

a width of the second end portion of each of the two third coil conductor layers is larger than a width of a portion other than the first end portion and the second end portion of each of the two third coil conductor layers; and the second end portions of the two third coil conductor layers oppose each other with the at least one of the base material layers interposed between the second end portions.

8. The common mode choke coil according to claim 7, wherein the first coil and the second coil are each provided in a spiral shape including a winding axis extending in the first direction; and the second end portions do not overlap with a center of a region surrounded by the first coil and the second coil when viewed in the first direction.

9. The common mode choke coil according to claim 1, wherein the main circuit includes parasitic capacitance generated between the first coil and the second coil; and the first resonant frequency is determined by the first coil, the second coil, and the parasitic capacitance.

10. The common mode choke coil according to claim 1, wherein the common mode choke coil includes two attenuation poles having different frequencies from each other.

11. An electronic apparatus comprising:
an electric circuit; and
a common mode choke coil; wherein
the common mode choke coil includes:
  a differential transmission line including a first signal line and a second signal line that are electrically connected to the electric circuit;
  a main circuit including a first coil provided in the first signal line, and a second coil provided in the second signal line and connected to the first coil by magnetic field coupling; and
  a parallel resonance circuit including a third coil connected to both the first coil and the second coil by magnetic field coupling, and a first capacitor electrically connected in parallel to the third coil; wherein
  a first resonant frequency of the main circuit is equal or substantially equal to a second resonant frequency of the parallel resonance circuit.

12. The common mode choke coil according to claim 2, wherein the conductor layers of the first coil define both a loop with a relatively small diameter and a loop with a relatively large diameter.

13. The common mode choke coil according to claim 12, wherein the conductor layers of the second coil define both a loop with a relatively small diameter and a loop with a relatively large diameter.

14. The common mode choke coil according to claim 6, wherein the two third coil conductor layers are each defined by linear conductor layers provided on front surfaces of respective ones of the base material layers; and the two third coil conductor layers have eddy shapes extending from inner circumference sides toward outer circumference sides when viewed from the front surfaces of the respective ones of the base material layers.

15. The common mode choke coil according to claim 1, wherein when a differential transmission signal including a first signal and a second signal having different phases from each other by 180 degrees is inputted to the first signal line and the second signal line, magnetic fluxes in opposite directions to each other are generated in the first coil and the second coil such that magnetic flux generated in the first coil and magnetic flux generated in the second coil cancel each other out.

16. The electronic apparatus according to claim 11, wherein when a differential transmission signal including a first signal and a second signal having different phases from each other by 180 degrees is inputted to the first signal line and the second signal line, magnetic fluxes in opposite directions to each other are generated in the first coil and the second coil in a manner such that magnetic flux generated in the first coil and magnetic flux generated in the second coil cancel each other out.

17. The common mode choke coil according to claim 1, wherein the first signal line includes a first input outer electrode and a first output outer electrode;

the second signal line includes a second input outer electrode and a second output outer electrode;

only the first coil is electrically connected between the first input outer electrode and the first output outer electrode; and only the second coil is electrically connected between the second input outer electrode and the second output outer electrode.

18. The electronic apparatus according to claim 11, wherein the first signal line includes a first input outer electrode and a first output outer electrode;

the second signal line includes a second input outer electrode and a second output outer electrode;

only the first coil is electrically connected between the first input outer electrode and the first output outer electrode; and only the second coil is electrically connected between the second input outer electrode and the second output outer electrode.

19. The electronic apparatus according to claim 11, wherein a parasitic capacitance is generated between the first coil and the second coil.

20. The common mode choke coil according to claim 6, wherein the third coil is positioned between the first coil and the second coil in the first direction within the element body.

* * * * *